(12) United States Patent
Lee

(10) Patent No.: US 7,465,630 B2
(45) Date of Patent: Dec. 16, 2008

(54) METHOD FOR MANUFACTURING FLASH MEMORY DEVICE

(75) Inventor: Young Bok Lee, Kyungki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 73 days.

(21) Appl. No.: 11/633,168

(22) Filed: Dec. 4, 2006

(65) Prior Publication Data

US 2007/0077710 A1    Apr. 5, 2007

Related U.S. Application Data

(63) Continuation of application No. 11/018,701, filed on Dec. 21, 2004, now Pat. No. 7,166,510.

(30) Foreign Application Priority Data

Mar. 30, 2004    (KR) ............... 2004-0021780

(51) Int. Cl.
*H01L 21/336* (2006.01)

(52) U.S. Cl. ............... 438/257; 438/201; 438/258; 438/266; 438/288; 438/298; 257/E21.625; 257/E21.684

(58) Field of Classification Search ............... None
See application file for complete search history.

(56) References Cited

U.S. PATENT DOCUMENTS

| 5,210,056 | A | * | 5/1993 | Pong et al. | ............... | 438/773 |
| 5,756,385 | A | | 5/1998 | Yuan et al. | ............... | 438/258 |
| 6,013,551 | A | | 1/2000 | Chen et al. | ............... | 438/264 |
| 6,218,689 | B1 | | 4/2001 | Chang et al. | ............... | 257/288 |
| 6,239,044 | B1 | | 5/2001 | Kashiwagi et al. | ............... | 438/787 |
| 6,790,728 | B1 | | 9/2004 | Dong et al. | ............... | 438/257 |
| 6,812,515 | B2 | | 11/2004 | Rabkin et al. | ............... | 257/315 |
| 2001/0045590 | A1 | * | 11/2001 | Kobayashi | ............... | 257/298 |
| 2003/0102503 | A1 | | 6/2003 | Rabkin et al. | | |
| 2003/0119255 | A1 | | 6/2003 | Dong et al. | ............... | 438/257 |

* cited by examiner

*Primary Examiner*—Fernando L Toledo
*Assistant Examiner*—Kyoung Lee
(74) *Attorney, Agent, or Firm*—Marshall, Gerstein & Borun LLP

(57) ABSTRACT

A method for manufacturing a flash memory device including the steps of forming a gate oxide film for high voltage on the whole surface of a semiconductor substrate on which a cell region, a low voltage region and a high voltage region have been formed, etching the gate oxide film for high voltage formed in the cell region and the low voltage region by a predetermined depth, by forming photoresist patterns to expose the gate oxide film for high voltage formed in the cell region and the low voltage region, and performing a wet etching process using the photoresist patterns as an etching mask, removing the entire gate oxide film for high voltage formed in the cell region and the low voltage region, by performing a cleaning process on the resulting structure, removing the photoresist patterns, forming a floating gate electrode and a control gate electrode, by sequentially forming a tunnel oxide film, a first polysilicon film, a second polysilicon film, a dielectric film, a third polysilicon film and a metal silicide film on the whole surface of the resulting structure, and patterning the resulting structure, and forming source and drain regions, by implanting ions by using the gate electrodes as an ion implant mask.

11 Claims, 5 Drawing Sheets

METHOD FOR MANUFACTURING FLASH MEMORY DEVICE

CROSS-REFERENCE TO RELATED APPLICATION

This is a continuation of currently-assigned U.S. Ser. No. 11/018,701 filed Dec. 21, 2004, the entire disclosure of which is incorporated herein by reference.

BACKGROUND

1. Field of the Invention

The present invention relates to a method for manufacturing a semiconductor device, and more particularly to, a method for manufacturing a flash memory device.

2. Discussion of Related Art

A process for forming a tunnel oxide film of a flash memory device forms a gate oxide film for high voltage on the whole surface of a semiconductor substrate, removes the gate oxide film for high voltage formed in a cell region and a low voltage region, and forms an appropriate thickness of tunnel oxide film in the cell region and the low voltage region.

However, the general process for removing the gate oxide film for high voltage formed in the cell region and the low voltage region does not completely remove the gate oxide film for the high voltage. The residual gate oxide film for high voltage deteriorates quality of the tunnel oxide film and uniformity of a thickness thereof.

There are thus increasing demands for a method for manufacturing a flash memory device which does not have detrimental effects on quality of the tunnel oxide film and uniformity of the thickness thereof.

SUMMARY OF THE INVENTION

The present invention is directed to a method for manufacturing a flash memory device which does not have detrimental effects on quality of a tunnel oxide film and uniformity of a thickness thereof.

One aspect of the invention is to provide a method for manufacturing a flash memory device, the method including: forming a gate oxide film for high voltage on the whole surface of a semiconductor substrate on which a cell region, a low voltage region and a high voltage region have been formed; forming photoresist patterns on the high voltage region to expose the gate oxide film for high voltage formed in the cell region and the low voltage region; performing a first removal step to etch the gate oxide film for high voltage formed in the cell region and the low voltage region by a predetermined depth to provide the gate oxide film of a predetermined thickness, by performing a wet etching process using the photoresist patterns as an etching mask; performing a second removal step to remove the entire gate oxide film for high voltage formed in the cell region and the low voltage region, by performing a cleaning process on the resulting structure; removing the photoresist patterns; sequentially forming a tunnel oxide film, a first polysilicon film, a second polysilicon film, a dielectric film, a third polysilicon film and a metal silicide film on the whole surface of the resulting structure; forming a floating gate electrode and a control gate electrode by patterning the resulting structure; and forming source and drain regions, by implanting ions by using the gate electrodes as an ion implant mask.

Preferably, the gate oxide film for high voltage is formed at a thickness of 300 Å to 400 Å, by performing a wet oxidation process at a temperature of 750° C. to 800° C. and an $N_2$ annealing process at a temperature of 900° C. to 910° C. for 20 minutes to 30 minutes.

Preferably, the wet etching process is performed by using an etching solution prepared by mixing BOE, $H_2SO_4$ and SC-1($NH_4OH/H_2O_2/H_2O$), so that the gate oxide film for high voltage can be left at a thickness of 15 Å to 45 Å.

Preferably, the cleaning process is performed by using DHF and SC-1($NH_4OH/H_2O_2/H_2O$).

Preferably, the tunnel oxide film is formed at a thickness of 70 Å to 100 Å, by forming a pure oxide film at a thickness of 60 Å to 90 Å by performing a wet oxidation process at a temperature of 750° C. to 800° C. and an $N_2$ annealing process at a temperature of 900° C. to 910° C. for 20 minutes to 30 minutes, and by performing a nitridation process using $N_2O$ gas annealing on the resulting film at a temperature of 800° C. to 1000° C. for 10 minutes to 30 minutes.

Preferably, the method for manufacturing the flash memory device further includes the steps of: forming a trench, by patterning the first polysilicon film, the tunnel oxide film and a predetermined depth of semiconductor substrate in order to define an element isolation region on the resulting structure on which the first polysilicon film has been formed; and forming an element isolation film by filling an oxide film in the trench, prior to the step for forming the second polysilicon film.

Preferably, the method for manufacturing the flash memory device further includes a step for forming an oxide film on the sidewalls of the trench at a temperature of 800° C. before filling the oxide film in the trench.

DETAILED DESCRIPTION OF PREFERRED EMBODIMENTS

Figure 1:
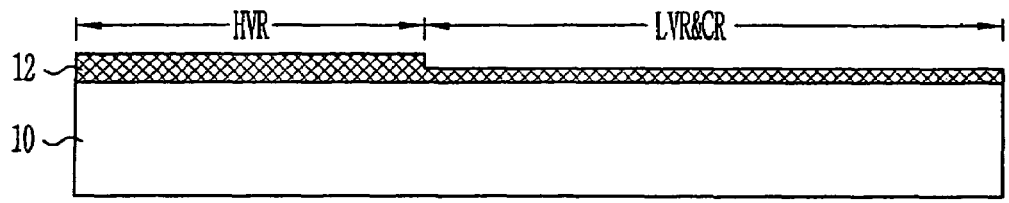
FIGS. 1 to 4 are cross-sectional diagrams illustrating sequential steps of a method for manufacturing a flash memory device in accordance with a preferred embodiment of the present invention.

A method for manufacturing a flash memory device in accordance with a preferred embodiment of the present invention will now be described in detail with reference to the accompanying drawings. The embodiment of the present invention can be modified in various forms, which is not intended to be limiting. The embodiment of the present invention is provided to fully explain the present invention to the ordinary people in the art to which the present invention pertains. In the drawings, a thickness of each film is exaggerated to provide clear and accurate explanations. Wherever possible, the same reference numerals will be used throughout the drawings and the description to refer to the same or like parts. In the case that it is described that one film is disposed on or contacts another film or a semiconductor substrate, one film can directly contact another film or the semiconductor substrate, or the third film can be positioned between them.

FIGS. 1 to 4 are cross-sectional diagrams illustrating sequential steps of the method for manufacturing the flash memory device in accordance with the preferred embodiment of the present invention.

Referring to FIG. 1, an ion implant process for forming wells on PMOS and NMOS regions and an ion implant process for controlling a threshold voltage are performed on a predetermined region of a semiconductor substrate 10 according to a photoetching process, thereby forming a well region (not shown) and a region (not shown) implanted with ions for controlling the threshold voltage in each region. The PMOS region, namely, the region on which a P-type transistor is formed, the NMOS region, namely, the region on which an N-type transistor is formed, a cell region (CR), a high voltage region (HVR) and a low voltage region (LVR) are defined on the semiconductor substrate 10.

On the other hand, in the well region, a P well is formed in a triple N well. Here, an ion implant dopant for forming the well region in the PMOS region is prepared by using B ions and implanted at a dose of 1.0E13 to 3.0E13 with an energy of 500 KeV to 600 KeV, at a dose of 1.0E13 to 3.0E12 with an energy of 200 KeV to 300 KeV, and at a dose of 2.0E12 to 7.0E12 with an energy of 50 KeV to 200 KeV, and an ion implant dopant for forming the well region in the NMOS region is prepared by using P ions and implanted at a dose of 1.0E13 to 3.0E13 with an energy of 1.0 MeV to 2.0 MeV. In addition, an ion implant angle of each region is tilted at an angle of 0° to 45° and twisted at an angle of 0° to 270°.

When the process for forming the well region (not shown) which forms the P well in the triple N well is finished, the region (not shown) implanted with the ions for controlling the threshold voltage is formed at a dose of 5.0E12 to 8.0E12 with an energy of 30 KeV to 70 KeV and at a dose of 5.0E12 to 8.0E14 with an energy of 10 KeV to 30 KeV. An ion implant angle of each region is tilted at an angle of 0° to 45° and twisted at an angle of 0° to 270°.

A gate oxide film 12 for high voltage is formed on the top surface of the semiconductor substrate 10 on which the region (not shown) implanted with the ions for controlling the threshold voltage has been formed. Preferably, the gate oxide film 12 for high voltage is formed at a thickness of 60 Å to 90 Å, by performing a wet oxidation process at a temperature of 750° C. to 800° C. and an $N_2$ annealing process at a temperature of 900° C. to 910° C. for 20 minutes to 30 minutes. Thereafter, photoresist patterns (not shown) are formed by performing a photoetching process, so that the gate oxide film 12 for high voltage can be left merely in the HVR. The gate oxide film 12 for high voltage formed in the CR and the LVR is removed by performing an etching process using the photoresist patterns (not shown) as an etching mask. Here, the gate oxide film 12 for high voltage formed in the CR and the LVR is firstly removed by performing a wet etching process using an etching solution prepared by mixing BOE, $H_2SO_4$ and SC-1($NH_4OH/H_2O_2/H_2O$), so that the gate oxide film 12 for high voltage can be left at a thickness of 15 Å to 45 Å. The photoresist patterns (not shown) are removed according to an etching process.

Figure 2:
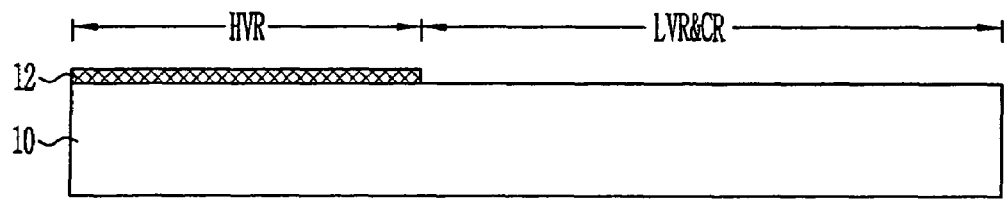

As shown in FIG. 2, the gate oxide film 12 for high voltage left in the CR and the LVR at a thickness of 15 Å to 45 Å is secondly removed by performing a cleaning process on the resulting structure on which the gate oxide film 12 for high voltage has been removed by a predetermined thickness. The cleaning process is performed by using DHF (50:1) and SC-1 ($NH_4OH/H_2O_2/H_2O$).

The method for manufacturing the flash memory device does not have detrimental effects on quality of a tunnel oxide film and uniformity of a thickness thereof, by removing the gate oxide film for high voltage formed in the CR and the LVR by a predetermined thickness according to the wet etching process, and completely removing the residual gate oxide film for high voltage according to the cleaning process.

Figure 3:
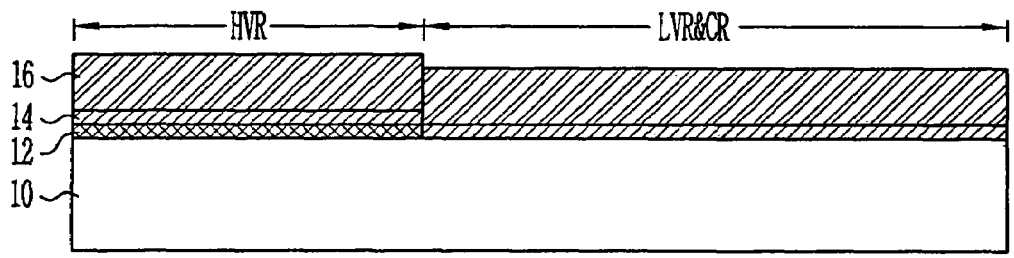

As illustrated in FIG. 3, a tunnel oxide film 14, a first polysilicon film 16 for a floating gate electrode, and a pad nitride film (not shown) are formed on the resulting structure.

Preferably, the tunnel oxide film 14 is formed at a thickness of 70 Å to 100 Å, by forming a pure oxide film at a thickness of 60 Å to 90 Å by performing a wet oxidation process at a temperature of 750° C. to 800° C. and an $N_2$ annealing process at a temperature of 900° C. to 910° C. for 20 minutes to 30 minutes, and by performing a nitridation process using $N_2O$ gas annealing on the resulting film at a temperature of 800° C. to 1000° C. for 10 minutes to 30 minutes.

Since the nitridation process is performed during the process for forming the tunnel oxide film 14, data retention fail properties which deteriorate properties of the tunnel oxide film 14 are prevented. As a result, quality of the tunnel oxide film 14 is improved.

The first polysilicon film 16 used as a part of the floating gate electrode is formed at a thickness of 200 Å to 800 Å at a temperature of 530° C. to 680° C. under a pressure of 0.1 torr to 3 torr. A grain size of the first polysilicon film 16 is minimized to prevent electric field concentration.

The pad nitride film (not shown) is formed at a thickness of 500 Å to 1000 Å.

A trench (not shown) for defining an element isolation region is formed by performing a photoetching process on a predetermined region of the pad nitride film (not shown). After forming the trench (not shown), an oxidation process for forming a sidewall oxide film is performed to compensate for etching damages on the sidewalls of the trench (not shown), thereby forming the oxide film on the sidewalls of the trench (not shown). The oxidation process for forming the sidewall oxide film is performed at a temperature of 800° C., which prevents deterioration of properties of the tunnel oxide film 14. Therefore, data retention properties of the tunnel oxide film 14 improved by the nitridation process are preserved.

An element isolation film (not shown) is formed by depositing an HDP oxide film on the trench (not shown), performing a planarization process such as a CMP process, and removing the pad nitride film (not shown).

Figure 4:
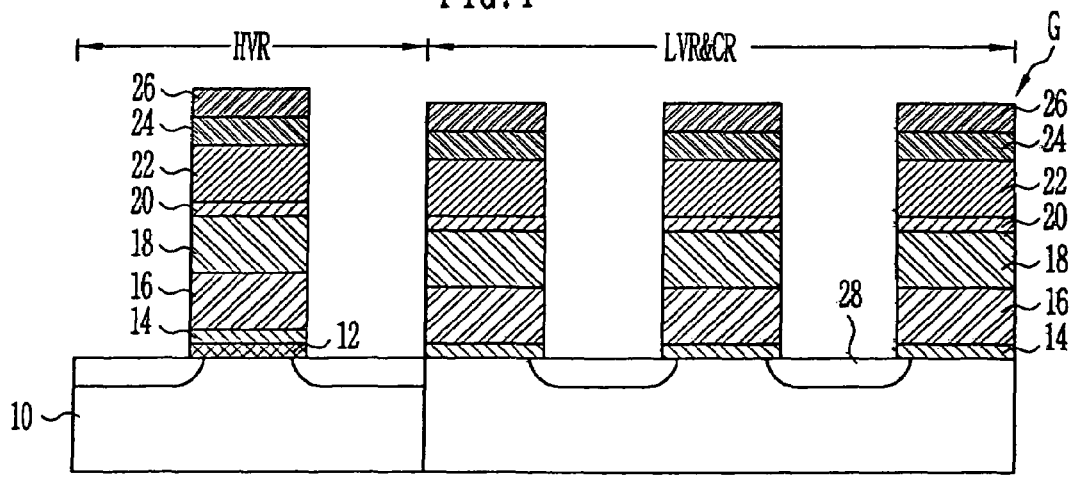

As depicted in FIG. 4, a second polysilicon film 18 for a floating gate electrode, a dielectric film 20 having an ONO structure, a third polysilicon film 22 for a control gate electrode, a tungsten silicide film 24 and a hard mask 26 are sequentially formed on the whole surface of the semiconductor substrate 10 on which the tunnel oxide film 14, the first polysilicon film 16 and the element isolation film (not shown) have been formed.

The second polysilicon film 18 is formed at a thickness of 1000 Å to 2000 Å.

The ONO dielectric film 20 is comprised of a first oxide film formed at a thickness of 40 Å to 60 Å at a temperature of 800° C. to 850° C. by using a DCS-HTO oxide film, a nitride film formed at a thickness of 40 Å to 80 Å at a temperature of 600° C. to 700° C. by using a nitride film, and a second oxide film formed at a thickness of 40 Å to 60 Å at a temperature of 800° C. to 850° C. by using a DCS-HTO oxide film.

The third polysilicon film 22 is formed at a thickness of 500° to 2000 Å with an ion concentration of 0.5e20 to 5.0e20 at a temperature of 400° to 500° C.

The tungsten suicide film 24 is formed at a thickness of 500 Å to 2000Å at a temperature of 400° C. to 500° C.

The hard mask 26 is formed by sequentially forming a PE-TEOS oxide film at a thickness of 800 Å to 2000 Å and an arcoxynitride film at a thickness of 300 Å to 1500 Å.

Thereafter, photoresist patterns (not shown) for forming a gate electrode are formed on the resulting semiconductor substrate 10. Floating gate electrode patterns and control gate electrode patterns G are formed respectively by performing an etching process using the photoresist patterns (not shown) as an etching mask.

Source and drain regions 28 are formed to overlap with the floating gate electrode patterns, by implanting ions into the semiconductor substrate 10 by using the gate electrode patterns G as an ion implant mask, thereby finishing the whole process. The source and drain regions 28 can be formed at a dose of 2.0E12 to 8.0E14 with an energy of 5 KeV to 30 KeV. Here, an ion implant angle of the region is tilted at an angle of 0° to 45° and twisted at an angle of 0° to 270°.

The method for manufacturing the flash memory device in accordance with the present invention has the following advantages.

First, uniformity of accumulative probability is achieved in CCST properties (checking properties of the tunnel oxide film by applying a predetermined stress) for the tunnel oxide film, by improving interface properties between the tunnel oxide film and the first polysilicon film by preventing damages of the semiconductor substrate.

Figure 5A:
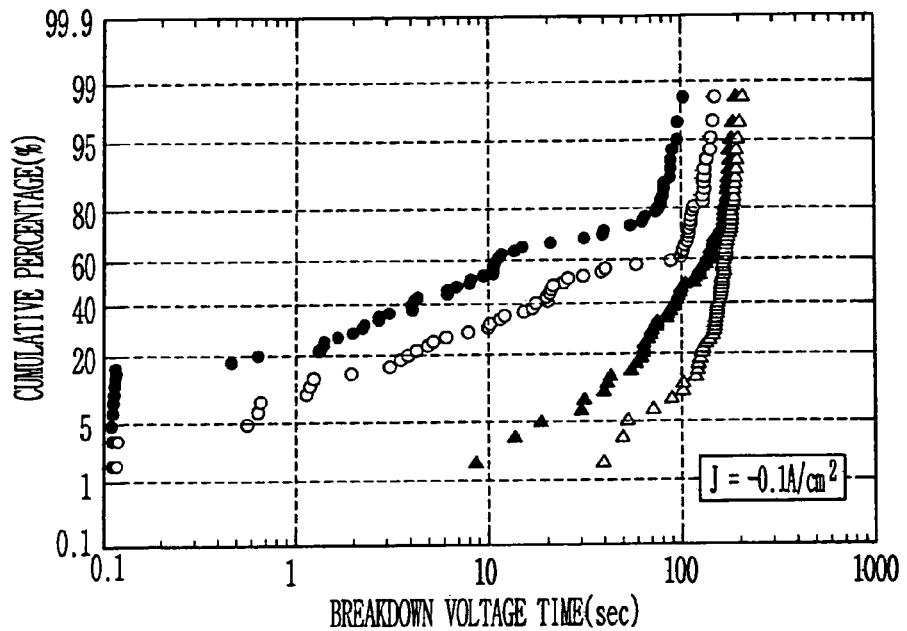
FIGS. 5A, 6A and 7A are graphs showing properties of a conventional tunnel oxide film.

Referring to FIG. 5A, in the conventional art, the gate oxide film for high voltage must be removed before forming the tunnel oxide film in the CR and the LVR. An etching time excessively increases to completely remove the gate oxide film for high voltage left in the CR and the LVR, which damages the semiconductor substrate and deteriorates the interface properties between the tunnel oxide film and the first polysilicon film. Therefore, uniformity of accumulative probability is not achieved in the CCST properties for the tunnel oxide film.

Figure 5B:
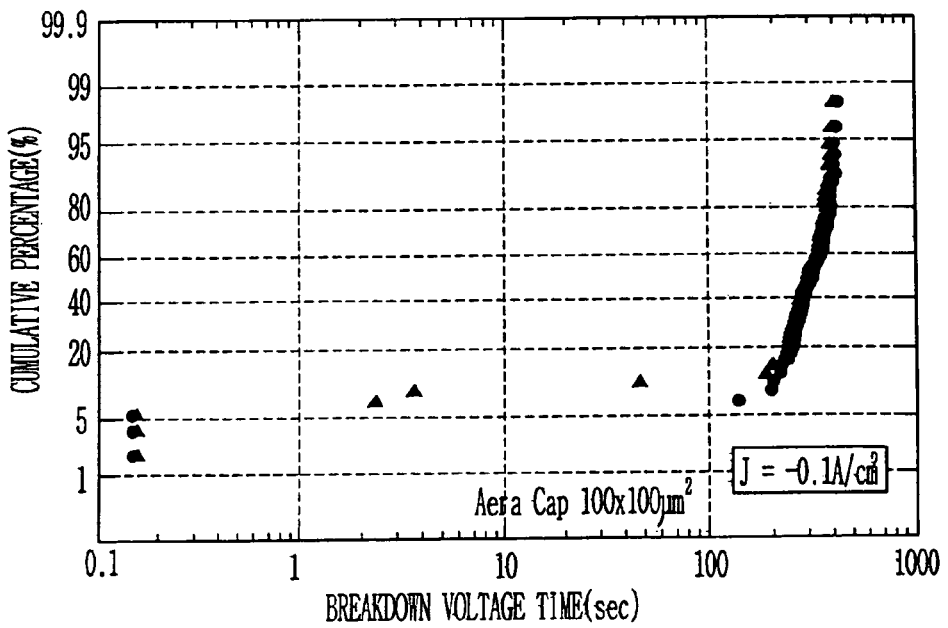
FIGS. 5B, 6B and 7B are graphs showing properties of a tunnel oxide film in accordance with the present invention.

In accordance with the present invention, the residual tunnel oxide film is appropriately controlled by adjusting the etching time of the tunnel oxide film formation region in the CR and the LVR, and removed according to the cleaning process in the formation of the tunnel oxide film. Accordingly, as shown in FIG. 5B, uniformity of accumulative probability is achieved in the CCST properties for the tunnel oxide film, by improving the interface properties between the tunnel oxide film and the first polysilicon film by preventing damages of the semiconductor substrate.

Second, cell cycling properties and retention properties are improved due to improvements of properties of the tunnel oxide film.

Figure 6A:
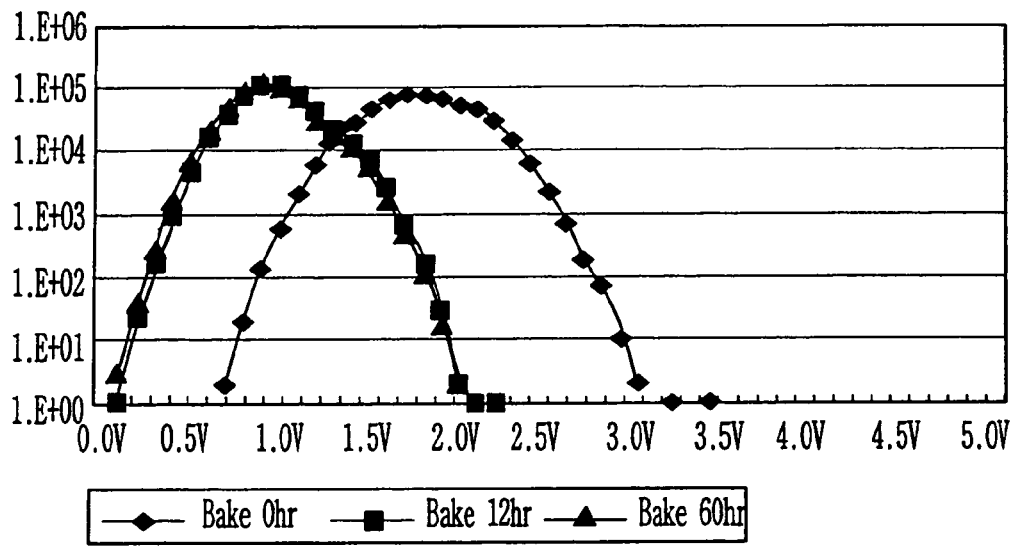

FIG. 6A shows conventional bake retention test results recorded after erase/write cycling to obtain early reliability for data retention. In order to obtain reliability for the data retention, program Vt is transferred in the bake retention by 1.0V after 10K cycling. Here, program Vt conditions range from 1.0V to 3.0V, and distribution of the currently-programmed cell is 1.5V. That is, a Vt transfer margin is only 0.5V, which causes failure. Although not illustrated, the same problem occurs in the erase operation. Since the program and erase operations are repeated after 10K erase and write cycling, electrons trapped inside the tunnel oxide film are detrapped, and the threshold voltage Vt is excessively transferred, to deteriorate bake retention properties.

Figure 6B:
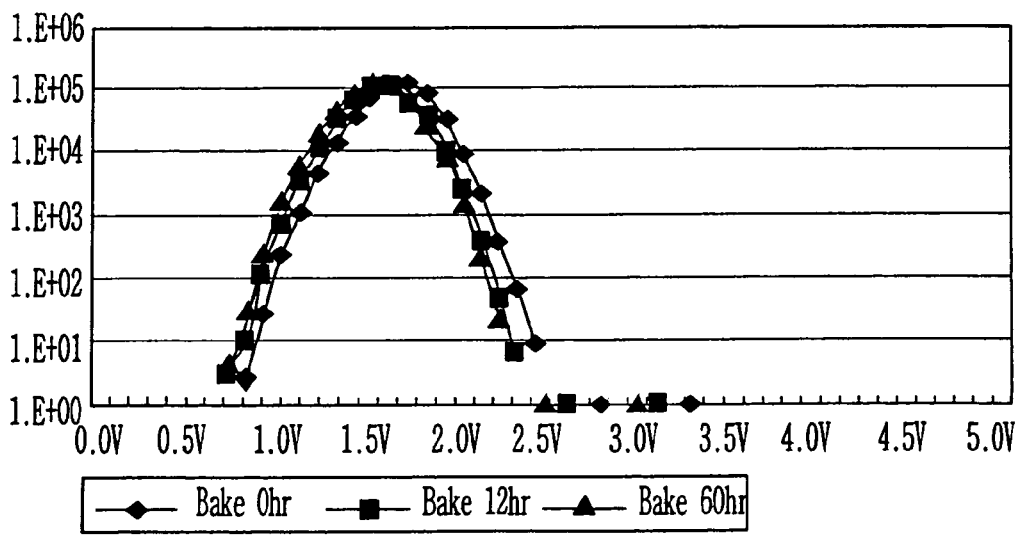

FIG. 6B shows bake retention test results recorded after erase/write cycling to obtain early reliability for data retention in accordance with the present invention. Since the program and erase operations are repeated after 10K erase and write cycling, detrapping of the electrons trapped inside the tunnel oxide film and excessive transfer of the threshold voltage Vt are prevented, to improve bake retention properties.

Figure 7A:
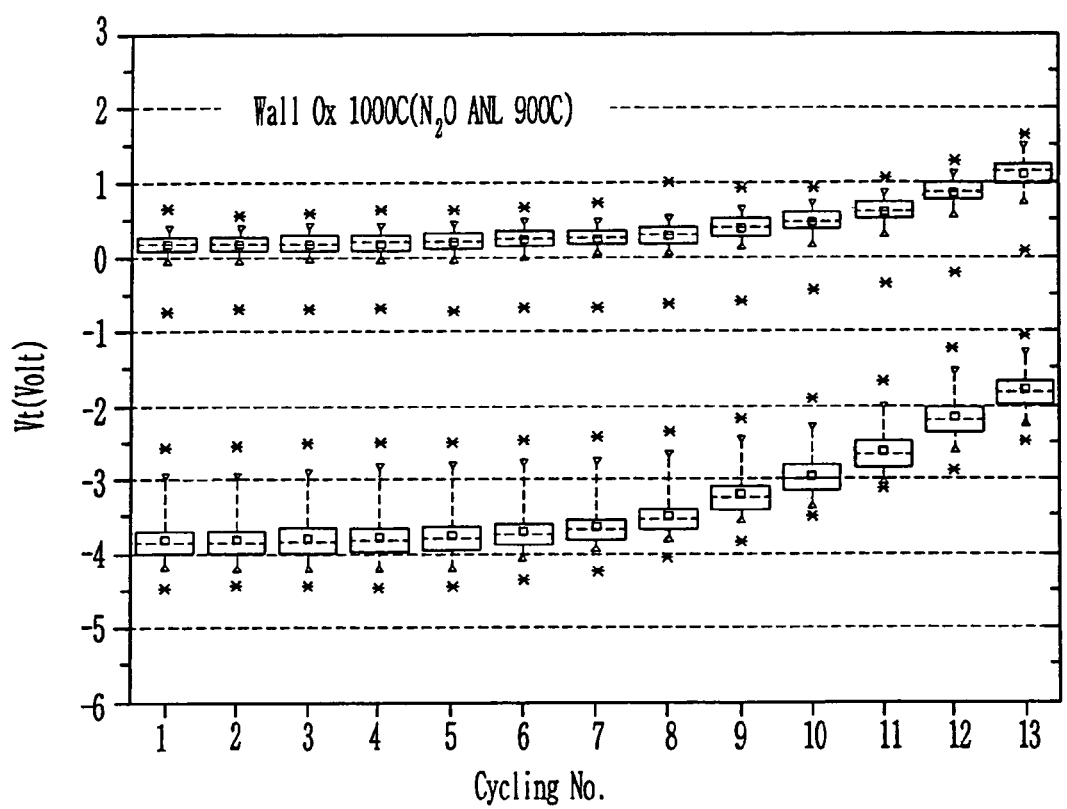
Figure 7B:
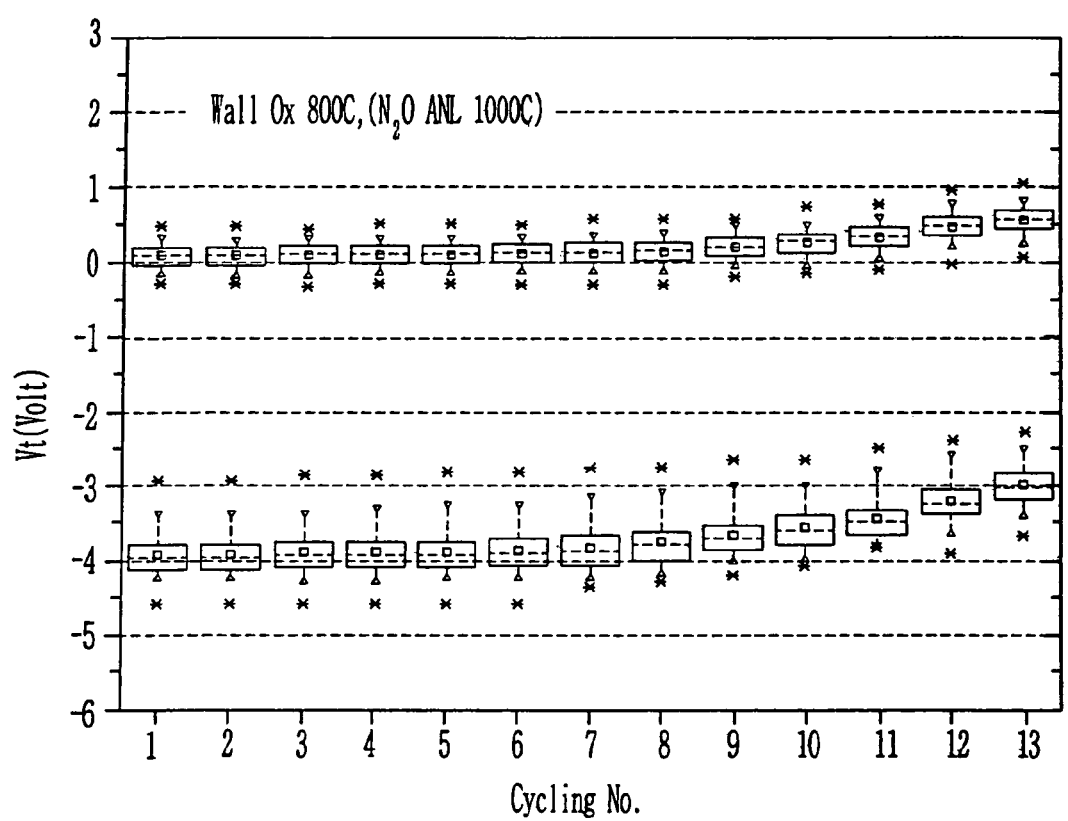

As illustrated in FIG. 7A, in the conventional art, the threshold voltage Vt is excessively transferred due to movement of the electrons trapped in the tunnel oxide film after erase/write cycling. Accordingly, cycling properties of the tunnel oxide film are deteriorated. Conversely, as shown in FIG. 7B, in accordance with the present invention, cycling properties of the tunnel oxide film are not deteriorated after erase/write cycling.

In accordance with the present invention, the method for manufacturing the flash memory device does not have detrimental effects on quality of the tunnel oxide film and uniformity of the thickness thereof, by removing the gate oxide film for high voltage formed in the CR and the LVR by a predetermined thickness according to the wet etching process, and completely removing the residual gate oxide film for high voltage according to the cleaning process.

As discussed earlier, in accordance with the present invention, the method for manufacturing the flash memory device does not have detrimental effects on quality of the tunnel oxide film and uniformity of the thickness thereof, by removing the gate oxide film for high voltage formed in the CR and the LVR by a predetermined thickness according to the wet etching process, and completely removing the residual gate oxide film for high voltage according to the cleaning process.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for manufacturing a flash memory device, the method comprising:
    forming a first gate insulating layer over a semiconductor substrate on which a cell region, a low voltage region, and a high voltage region have been formed;
    partially removing the first gate insulating layer in the low voltage region and the cell region by performing a first process;
    removing the remaining first gate insulating layer in the low voltage region and the cell region by performing a second process; and
    forming a second gate insulating layer over the first gate insulating layer in the high voltage region and over the semiconductor substrate in the cell region and low voltage region.

2. The method of claim 1, wherein the first process comprises a wet etching process and the second process comprises a cleaning process.

3. The method of claim 1, comprising removing the first gate insulating layer using a photoresist pattern as a mask.

4. The method of claim 1, comprising forming the first gate insulating layer at a thickness of 300 Å to 400 Å, by performing a wet oxidation process at a temperature of 750° C. to 800° C. and an $N_2$ annealing process at a temperature of 900° C. to 910° C. for 20 minutes to 30 minutes.

5. The method of claim 1, wherein the thickness of the remaining first insulating layer is about 15 Å to 45 Å.

6. The method of claim 2, comprising performing the wet etching process by using an etching solution comprising BOE, $H_2SO_4$, and SC-1($NH_4OH/H_2O_2/H_2O$).

7. The method of claim 2, comprising performing the cleaning process using DHF and SC-1($NH_4OH/H_2O_2/H_2O$).

8. The method of claim 1, comprising forming the second gate insulating layer at a thickness of 70 Å to 100 Å, by forming a pure oxide film at a thickness of 60 Å to 90 Å by performing a wet oxidation process at a temperature of 750° C. to 800° C. and an $N_2$ annealing process at a temperature of about to about for 20 minutes to 30 minutes.

9. The method of claim 8, wherein the forming the second gate insulating layer further includes performing a nitridation process using $N_2O$ gas annealing at a temperature of 800° C. to 1000° C. for 10 minutes to 30 minutes after the $N_2$ annealing process.

10. The method of claim 1, further includes:
forming a isolation structure in the semiconductor substrate; and forming a gate structure formed with a floating gate, a dielectric layer and a control gate.

11. The method of claim 1, comprising forming the first gate insulating layer by a wet oxidation process.

* * * * *